United States Patent [19]

Haydon

[11] 3,959,628

[45] May 25, 1976

[54] ELECTRICAL READ-OUT APPARATUS

[75] Inventor: Arthur W. Haydon, Middlebury, Conn.

[73] Assignee: Tri-tech, Inc., Waterbury, Conn.

[22] Filed: Sept. 30, 1974

[21] Appl. No.: 510,614

[52] U.S. Cl. .................... 235/61.11 E; 340/188 R; 346/14 MR
[51] Int. Cl.² ................. G08U 19/00; G08U 25/04; G06R 7/10
[58] Field of Search ......... 235/61.11 E; 346/14 MR; 340/188 R, 188 CH, 190; 250/234, 216, 566, 570

[56] References Cited
UNITED STATES PATENTS

| | | | |
|---|---|---|---|
| 1,847,590 | 3/1932 | Burwood | 346/14 MR |
| 3,441,923 | 4/1969 | King | 346/14 MR |
| 3,710,078 | 1/1973 | Lemelson | 235/61.11 E |
| 3,857,020 | 12/1974 | Higginbotham | 235/61.11 E |

Primary Examiner—Vincent P. Canney
Attorney, Agent, or Firm—Curtis, Morris and Safford

[57] ABSTRACT

A watt-hour meter or other visual read-out apparatus which may also be read electrically through the use of a plurality of code discs and a photoelectric sensing device in spaced juxtaposition with the back sides of the discs. The sensing device is supported by a cable-controlled carriage which reciprocates back and forth in a direction parallel to the discs under the control of a bidirectional electric motor. A pair of stop members are located at opposite ends of the path of travel of the carriage for causing the motor to reverse direction as the carriage contacts one of the stop members.

13 Claims, 5 Drawing Figures

3,959,628

ELECTRICAL READ-OUT APPARATUS

BACKGROUND OF THE INVENTION

This invention relates to read-out apparatus and more particularly to apparatus for producing both a visual and an electrical read-out of a varying input signal.

The present invention, while of general application, is particularly well suited for use with watt-hour meters or other indicating devices to provide an electrical signal corresponding to the visual reading on the meter. As will be understood, meters of this type commonly include a plurality of indicating pointers which are read in succession to determine the actual reading of the meter at a given time. In cases in which the meter has an electrical read-out capability, the electrical signal may be received and recorded at a remotely located central station and used for billing purposes, for example.

Heretofore, difficulties were encountered in the construction and operation of read-out apparatus of the foregoing type. As an illustration, the structure of many such prior apparatus was unnecessarily complicated, and the apparatus was expensive to manufacture. In addition, and this has been of special moment in read-out apparatus for watt-hour meters, the apparatus often exhibited comparatively large power requirements and required drive motors of overly sophisticated design. Furthermore, problems frequently resulted when attempts were made to electrically scan the successive indicating devices of the apparatus and to return the scanning mechanism to its initial position in preparation for a succeeding scan.

SUMMARY

One general object of this invention, therefore, is to provide a new and improved read-out apparatus having an electrical read-out capability.

More specifically, it is an object of this invention to provide such read-out apparatus in which the overall structure of the apparatus is simplified in a number of respects.

Another object of this invention is to provide read-out apparatus of the character indicated in which the power requirements of the apparatus are substantially reduced.

A still further object of this invention is to provide read-out apparatus utilizing comparatively simple mechanical and electrical components which is economical to manufacture and thoroughly reliable in operation.

In one illustrative embodiment of the invention, the read-out apparatus comprises a plurality of visual read-out devices. Each of these devices includes a rotary shaft and a pointer or other indicating means in fixed relationship with the shaft. A plurality of code members, preferably in the form of discs, are respectively mounted on the shafts, and each of these discs is provided with selected code areas on the disc surface opposite that which faces the indicating means. As the shafts rotate to change the positions of the indicating means, the code discs likewise rotate in accordance with the applied input signal.

In accordance with one feature of the invention, in certain particularly important embodiments, unique scanning means is provided in spaced juxtaposition with the sides of the code members opposite those facing the indicating means. The construction and mode of operation of the scanning means enables the realization of an electrical read-out feature for the apparatus while at the same time providing an extremely compact and simplified structure.

In accordance with another feature of the invention, in several advantageous arrangements, the apparatus includes a reciprocating carriage for advancing the scanning means back and forth in a direction parallel to the code members. The carriage exhibits extremely low power requirements and enables the scanner to sense the angular position of each code member in a rapid and straightforward manner.

In accordance with a further feature of some embodiments of the invention, the scanning means is operated by a drive mechanism which is provided with a bidirectional electric motor and a pair of stop members at opposite ends of the path of travel of the carriage. As the carriage comes in contact with one of the stop members, the motor automatically reverses direction to similarly reverse the direction of movement of a carriage.

The present invention, as well as further objects and features thereof, will be understood more clearly and fully from the following description of a preferred embodiment, when read with reference to the accompanying drawings.

DESCRIPTION OF A PREFERRED EMBODIMENT

Figure 1:
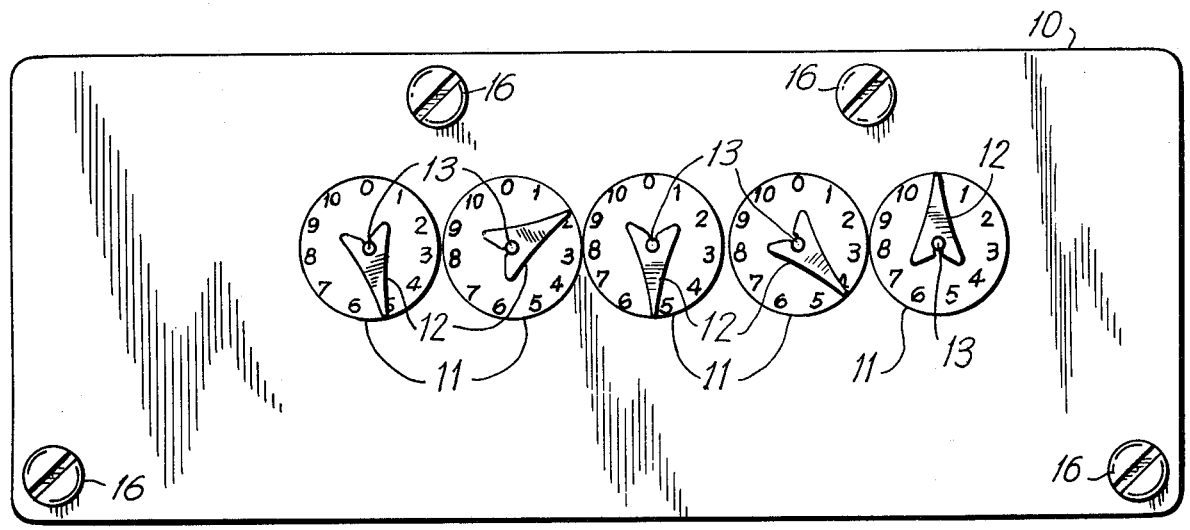
FIG. 1 is a front elevational view of read-out apparatus in the form of a watt-hour meter in accordance with one illustrative embodiment of the invention.

Referring to FIG. 1 of the drawings, there is shown a watt-hour meter having a rectangular face plate 10. Five indicia bearing dials 11 are affixed to the face plate in the usual way, and these dials respectively cooperate with five indicating pointers 12. Each of the pointers 12 is mounted adjacent the outer end of a rotary shaft 13. The shafts are arranged with their axes in coplanar, parallel relationship with each other, and the shafts extend through the face plate 10 with the pointers 12 affixed to the protruding outer ends of the shafts.

Figure 2:
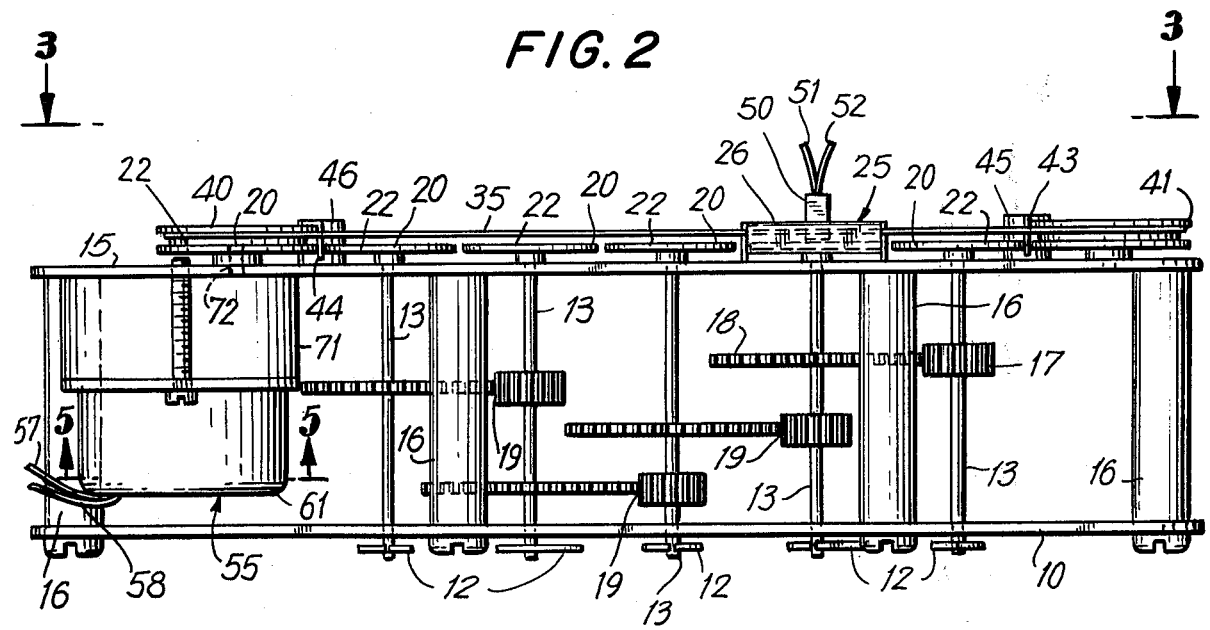
FIG. 2 is a top plan view of the apparatus shown in FIG. 1.

As best shown in FIG. 2, a rectangular back plate 15 is maintained in spaced relationship with the face plate 10 by suitable spacers 16. The ends of the rotary shafts 13 opposite those which carry the indicating pointers 12 extend through the plate 15 to provide the necessary support. The shafts 13 are arrayed in progressively increasing order from right to left, as viewed in FIGS. 1 and 2, such that the indicating pointer 12 for the right-hand shaft denotes units, the pointer 12 for the adjacent shaft denotes tens of units, etc. The right hand shaft 13 is provided with an input pinion 17 intermediate the plates 10 and 15 which is in meshing engagement with a spur gear 18 on the adjacent shaft. This latter shaft in turn is connected to the succeeding shaft by a gear and pinion assembly 19 which is also located between the plates. Successive additional gear and pinion assemblies 19 serve to interconnect the succeeding shafts in order to provide the desired reduction which in this case is ten to one between each pair of adjacent shafts.

The input pinion 17 is effective to rotate the various shafts 13 and thus move the corresponding indicating pointers 12 in accordance with a varying input signal representative of watt-hours or other input information. The rotation of the shafts 13 pivots the pointers 12 relative to the indicia bearing dials 11 to provide a visual read-out corresponding to the input signal.

Figure 3:
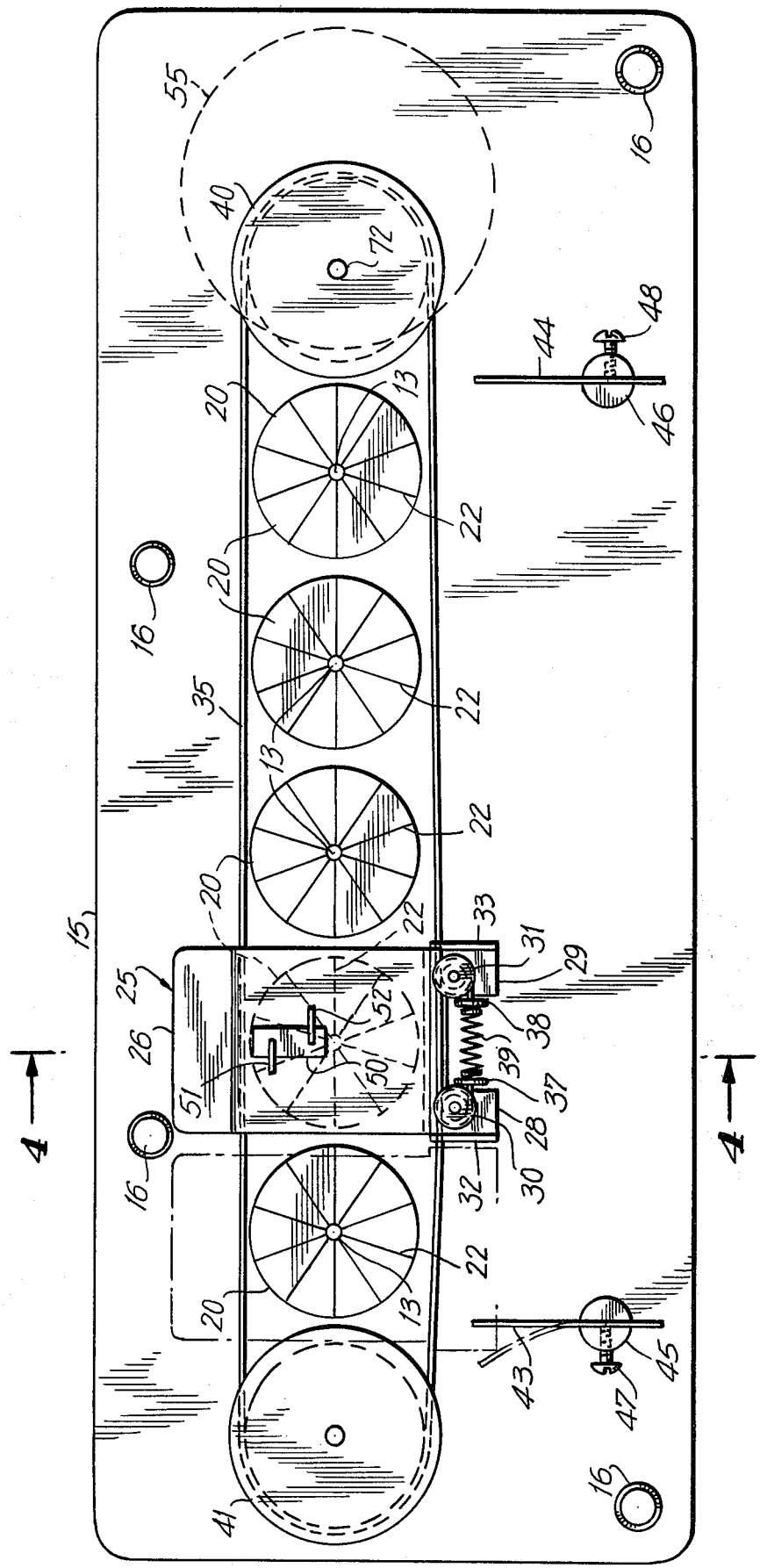
FIG. 3 is an enlarged rear view of the apparatus as seen from the line 3—3 in FIG. 2.
Figure 4:
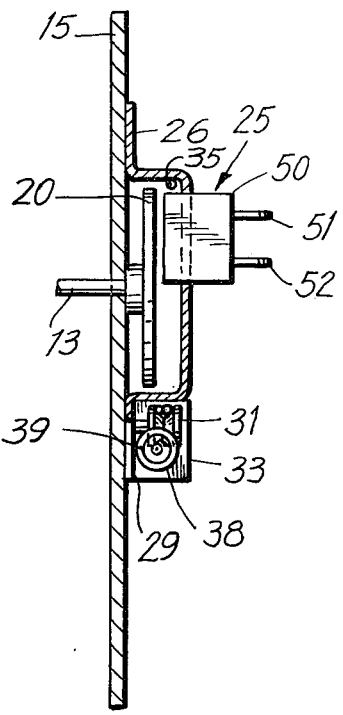
FIG. 4 is a fragmentary sectional view taken along the line 4—4 in FIG. 3.

A plurality of code discs 20, one for each of the indicating pointers 12, are respectively mounted on the corresponding shafts 13 in coaxial relationship therewith. The code discs 20 are connected to the ends of the shafts 13 which protrude through the back plate 15. As best illustrated in FIG. 3, each of the discs 20 is provided with selected areas or sectors 22 of varying reflectivity on the back surface of the disc, that is, the surface opposite that which faces the corresponding pointer 12. In the embodiment shown each disc includes 10 of the sectors 22, corresponding to the 10 digits on the associated dial 11 (FIG. 1), and each of the sectors on a given disc exhibits different reflective properties. The sectors may comprise wedge-shaped pieces of reflective tape, for example, or they may be formed by reflective paint or other appropriate coating material.

Supported in juxtapositon with the disc sectors 22 is a scanning mechanism 25. The mechanism 25 includes a translatory carriage 26 of generally U-shaped cross-section which preferably is fabricated from aluminum or other comparatively light material. This carriage includes a pair of depending tabs 28 and 29 which bear against the back surface of the plate 15 and respectively support two cylindrical studs 30 and 31. Two flanges 32 and 33 are bent outwardly from the respective tabs 28 and 29 for purposes that will become more fully apparent hereinafter.

The scanning mechanism 25 is arranged to reciprocate back and forth in a direction parallel to the code discs 20 under the control of a flexible cable 35. The cable 35 illustratively is of nylon, and its ends are provided with retaining members 37 and 28, respectively. The members 37 and 38 are located adjacent the carriage studs 30 and 31 and are interconnected by a coil spring 39.

The end of the cable 35 is affixed to the retaining member 37, passes around a peripheral groove in the stud 30 to reverse the direction of the cable. From the stud 30 the cable proceeds around a drive pulley 40 adjacent one end of the back plate 15, then between the carriage 26 and the back plate, then around an idler pulley 41 adjacent the opposite end of the plate, and then around a peripheral groove in the stud 31 to the retaining member 38. The arrangement is such that the opposite ends of the cable are resiliently connected to the carriage 26 by means of the retaining members 37 and 38 and the coil spring 39.

A pair of stop members in the form of leaf springs 43 and 44 are respectively disposed at opposite ends of the path of travel of the scanning mechanism 25. The leaf springs 43 and 44 are slidably located in corresponding posts 45 and 46 affixed to the back plate 15 and are adjustable held in place by set screws 47 and 48. From the posts 45 and 46 the springs 43 and 44 extend upwardly toward the cable 35 in parallel relationship with each other such that the free ends of the springs are in position to engage the flanges 32 and 33, respectively, on the carriage 26.

A photoelectric cell 50 or other optical sensing device is mounted in a mating aperture in the carriage 26. The cell 50 is located in position to optically detect the various reflective sectors 22 on the code discs 30 and is provided with output leads 51 and 52. These leads produce electrical read-out signals in accordance with the particular disc sector being scanned at a given time. The cell 50 by itself is conventional and is available commercially from Sensor Technology, Inc., Chatsworth, California, Model STRT-850.

Figure 5:
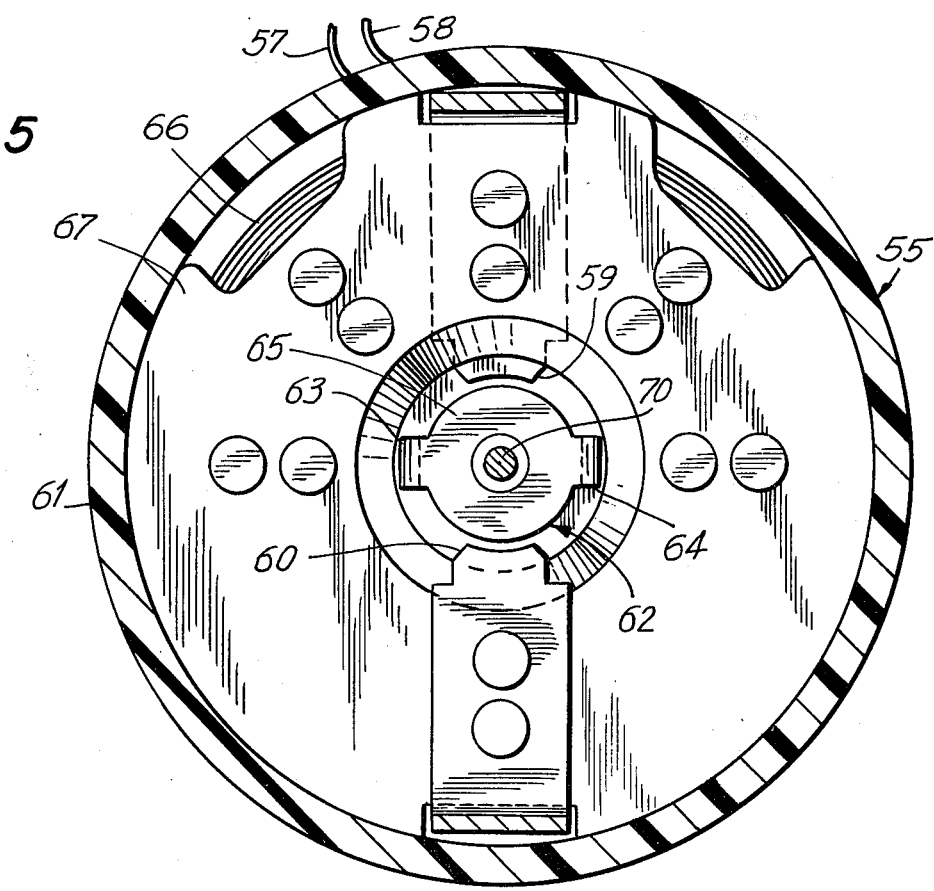
FIG. 5 is a sectional view of the motor for the apparatus taken along the line 5—5 in FIG. 2.

The scanning mechanism 25 operates under the control of an electric drive motor 55. The motor 55 is in the form of a bidirectional synchronous motor and is electrically connected through lead wires 57 and 58 and a suitable on-off switch (not shown) to a source of alternating current. As best illustrated in FIG. 5, the motor 55 includes a single pair of salient stator poles 59 and 60 and a nonmagnetic motor housing 61. As more fully described in copending U.S. Ser. No. 495,928 filed Aug. 8, 1974 by Arthur W. Haydon, the motor additionally is provided with a U-shaped detent device 62 having a pair of auxiliary pole members 63 and 64 and a return path member 65. An energizing winding 66 cooperates with the stator poles 59 and 60 and is supported by a bobbin 67. The winding 66 and the bobbin 67 are in coaxial relationship with a permanent magnet ferrite rotor 70 having a single pair of nonsalient rotor poles which, in the quiescent position of the rotor, are attracted by the pole members 63 and 64 on the detent device 62 such that, upon energization of the winding, the rotor exhibits a self-starting characteristic.

Contrary to the illustrative embodiments shown in the drawings for Haydon U.S. Ser. No. 495,928, the auxiliary pole members 63 and 64 of the motor 55 are oriented at right angles with respect to the main stator poles 59 and 60. With this arrangement, the motor 55 exhibits a bidirectional rather than a unidirectional self-starting characteristic. Thus, upon the application of alternating current through the lead wires 57 and 58 to the energizing winding 66 of the motor, the rotor 70 begins its rotation in either a clockwise or counter-clockwise direction depending upon the polarity of the first one-half cycle of the applied ac wave.

As best shown in FIG. 2, the motor 55 is mounted on the inner surface of the back plate 15. The motor includes a gear housing 71 which contains a reduction gear train to provide the desired speed reduction between the rotor 70 (FIG. 5) and an output shaft 72. The shaft 72 extends through an appropriate aperture in the back plate 15 and carries the drive pulley 40 at its protruding end.

During normal operation of the apparatus the various shafts 13 rotate under the control of the input pinion 17 in accordance with the varying input signal to move the pointers 12 relative to their corresponding dials 11. The pointers 12 cooperate with the dials 11 to provide a visual numerical reading of the input signal.

To obtain an electrical reading the drive motor 55 is energized to rotate the rotor 70 and the attached output shaft 72. The shaft 72 drives the pulley 40 and the flexible cable 35 to move the scanning mechanism 25 in a direction parallel to the rear faces of the code discs 20. As the photoelectric cell 50 passes each disc, it detects a particular reflective sector 22 on the disc corresponding to the numerical reading of the corresponding indicating pointer 12 to produce an electrical read-out signal on the output leads 51 and 52. The successive output signals corresponding to the five discs are transmitted over the wires 57 and 58 to a central station where they are decoded and recorded.

Upon the movement of the scanning mechanism 25 to the left, as viewed in FIG. 3, past each of the five code discs 20, the flange 32 on the carriage 26 comes in contact with the leaf spring 43 adjacent the idler pulley 41. The spring 43 resiliently arrests the movement of the carriage 26, and the cable 35, the pulleys 40 and 41 and the output shaft 72 likewise come to rest to prevent further rotation of the rotor 70 (FIG. 5) in the forward or scanning direction. As the energizing winding 66 of the motor 55 receives the next half cycle alternating current wave, however, the rotor 70 begins to turn in the reverse direction to draw the carriage 26 back across the code discs 20 to it initial position with the carriage flange 33 in contact with the leaf spring 44.

The arrangement is such that each time the carriage 26 contacts one of the leaf springs 43 and 44, the carriage automatically reverses direction and returns across the code discs 20. The photoelectric cell 50 on the carriage 26 scans the reflective sectors 22 on the discs 20 during both its forward and its reverse movement to provide the desired number of electrical readings of the positions of the discs.

The carriage 26 continues to reciprocate across the back faces of the code discs 20 during the application of alternating current to the drive motor 55. To operate the motor 55 for a present period of time sufficient for the carriage 26 to make one scanning pass in the forward direction and to then return to its initial position, the lead wires 57 and 58 of the motor 55 may be connected to the current source through a suitable time delay relay (not shown), for example. At the termination of its timing period, the relay deenergizes the motor winding to automatically bring the carriage to rest in position for a succeeding electrical reading.

In the illustrated embodiment of the invention, the positions of the code discs 20 are sensed by the photoelectric cell 50 or other optical detecting means. In other advantageous arrangements the positions of the discs may be sensed through the use of one or more wiper contacts on the carriage 26 or by other suitable detecting devices.

The terms and expressions which have been employed are used as terms of description and not of limitation, and there is no intention in the use of such terms and expressions of excluding any equivalents of the features shown and described or portions thereof, but is recognized that various modifications are possible within the scope of the invention claimed.

What is claimed is:

1. Read-out apparatus comprising, in combination:
   a plurality of read-out devices responsive to a varying input signal;
   a plurality of code elements, one for each of the read-out devices, respectively connected in operative relationship therewith, each of the code elements having a reflective surface containing selected code areas which face away from the corresponding read-out device;
   means for operating the read-out devices and the code elements in accordance with said input signal;
   light-weight carriage means supported in juxtapositon with the code areas on said elements for movement relative thereto;
   only a single sensing device carried by the carriage means in position to produce electrical read-out signals determined by the selected areas of said code elements, and
   a drive mechanism for causing the carriage means and the sensing device to move past each of said code elements.

2. Read-out apparatus comprising, in combination:
   a plurality of read-out devices responsive to a varying input signal;
   a plurality of code elements, one for each of the read-out devices, spaced from said read-out devices and respectively connected in operative relationship therewith, each of the code elements having a reflective surface containing selected code areas which face away from the corresponding read-out device;
   means for operating the read-out devices and the code elements in accordance with said input signal;
   light-weight carriage means supported in juxtaposition with the code areas on said elements for movement in a direction parallel thereto;
   only a single sensing device carried by the carriage means in position to produce electrical read-out signals determined by the selected areas of said code elements; and
   a drive mechanism for causing the carriage means and the sensing device to reciprocate back and forth in a direction parallel to said selected areas.

3. Read-out apparatus as defined in claim 2, in which the drive mechanism comprises a bidirectional alternating current motor operatively connected to the carriage means and a pair of stop members at opposite ends of the path of travel of the carriage means for causing the motor to reverse direction as the carriage means contacts one of the stop members, the direction of rotation of said motor being determined by the first half cycle of applied alternating current of the correct polarity, said stop members preventing rotation of said motor during the first half cycle of incorrect polarity.

4. Read-out apparatus comprising, in combination:
   a plurality of visual read-out devices responsive to a varying input signal;
   a plurality of code elements, one for each of the visual read-out devices, in spaced relationship therewith, each of the code elements having selected code areas which face away from the corresponding read-out device;
   means interconnecting the visual read-out devices with the respective code elements for operating said elements in accordance with said input signal;
   light-weight carriage means supported in juxtaposition with the code areas on said elements for movement in a direction parallel thereto;
   only a single sensing device carried by the carriage means in position to produce electrical read-out signals determined by the selected areas of said code elements; and
   a drive mechanism for causing the carriage means and the sensing device to move past each of said code elements.

5. Read-out apparatus comprising, in combination:
   a plurality of read-out devices responsive to a varying input signal;
   a plurality of code elements, one for each of the read-out devices, respectively connected in operative relationship therewith;

means for operating the read-out devices and the code elements in accordance with said input signal;

carriage means supported in juxtaposition with said code elements for movement relative thereto;

a sensing device carried by the carriage means in position to produce electrical read-out signals determined by said code elements; and a drive mechanism for causing the carriage means and the sensing device to reciprocate back and forth past said code elements, the drive mechanism having an alternating current motor operatively connected to the carriage means and a pair of stop members at opposite ends of the path of travel of the carriage means for causing the motor to automatically reverse direction as the carriage means contacts one of the stop members, the direction of rotation of said motor being determined by the first half cycle of applied alternating current of the correct polarity, said stop members preventing rotation of said motor during the first half cycle of incorrect polarity.

6. Read-out apparatus as defined in claim 5, in which each of the code elements comprises a rotary disc having selected code areas on one of its faces.

7. Read-out apparatus comprising, in combination:

a plurality of visual read-out devices, each of the read-out devices including a rotary shaft and indicating means affixed to the shaft for rotation therewith;

a plurality of code elements, one for each of the visual read-out devices, respectively mounted on the corresponding shafts in spaced relationship with the associated indicating means;

means for rotating the shafts to change the positions of the visual read-out devices and the code elements in accordance with a varying input signal;

carriage means supported in juxtaposition with said code elements for movement relative thereto;

a sensing device carried by the carriage means in position to produce electrical read-out signals determined by said code elements; and a drive mechanism for causing the carriage means and the sensing device to reciprocate back and forth past said code elements, the drive mechanism having a bidirectional alternating current motor operatively connected to the carriage means and a pair of stop members at opposite ends of the path of travel of the carriage means for causing the motor to reverse direction as the carriage means contacts one of the stop members, the direction of rotation of said motor being determined by the first half cycle of applied alternating current of the correct polarity, said stop members preventing rotation of said motor during the first half cycle of incorrect polarity.

8. Read-out apparatus comprising, in combination:

a plurality of read-out devices responsive to a varying input signal;

a plurality of code discs, one for each of the read-out devices, respectively connected in operative relationship therewith, each of the code discs having a reflective disc surface facing away from the corresponding read-out device;

means for operating the read-out devices and the code discs in accordance with said input signal;

light-weight carriage means supported in juxtaposition with said disc surfaces for movement in a direction parallel thereto;

only a single sensing device carried by the carriage means in position to produce electrical read-out signals determined by said code discs; and a drive mechanism for causing the carriage means and the sensing device to reciprocate back and forth in a direction parallel to said code discs.

9. Read-out apparatus as defined in claim 8, in which the carriage means comprises a reciprocably movable carriage and cable means connected to the carriage for advancing said carriage past said disc surfaces.

10. Read-out apparatus comprising, in combination:

a plurality of visual read-out devices responsive to a varying input signal, each of the read-out devices including a rotary shaft and indicating means affixed to the shaft for rotation therewith;

a plurality of code discs, one for each of the visual read-out devices, respectively mounted on the corresponding shafts in coaxial relationship therewith and in spaced relationship with the associated indicating means, each of the code discs having selected code areas on the disc surface opposite that which faces said indicating means;

means for rotating the shafts to change the positions of the visual read-out devices and the code discs in accordance with said input signal;

light-weight carriage means supported in juxtaposition with said opposite disc surfaces for movement in a direction parallel thereto, said carriage means including a reciprocable carriage of generally U-shaped cross-section, a cable for supporting said carriage, and resilient means for connecting said carriage to the ends of said cable;

a sensing device carried by the carriage means in position to produce electrical read-out signals determined by the selected areas of said code discs; and a drive mechanism for causing the carriage means and the sensing device to reciprocate back and forth in a direction parallel to said code discs.

11. Read-out apparatus as defined in claim 10, in which the selected code areas are of different reflectivity, and said sensing device comprises a photoelectric cell responsive to the reflectivity of each area.

12. Read-out apparatus comprising, in combination:

a plurality of visual read-out devices, each of the read-out devices including a rotary shaft and indicating means affixed to the shaft for rotation therewith;

a plurality of code discs, one for each of the visual read-out devices, respectively mounted on the corresponding shafts in coaxial relationship therewith and in spaced relationship with the associated indicating means, each of the code discs having selected code areas on the disc surface opposite that which faces said indicating means;

means for rotating the shafts to change the positions of the visual read-out devices and the code discs in accordance with a varying input signal;

carriage means supported in juxtaposition with said opposite disc surfaces for movement in a direction parallel thereto;

a sensing device carried by the carriage means in position to produce electrical read-out signals determined by the selected areas of said code discs; and a drive mechanism for causing the carriage means and the sensing device to reciprocate back and forth in a direction parallel to said code discs, the drive mechanism having a bidirectional alternating current motor operatively connected to the carriage means and a pair of stop members at opposite ends of the path of travel of the carriage means for causing the motor to reverse direction as the carriage means contacts one of the stop members, the direction of rotation of said motor being determined by the first half cycle of applied alternating current of the correct polarity, said stop members preventing rotation of said motor during the first half cycle of incorrect polarity.

13. Read-out apparatus comprising, in combination:

a plurality of visual read-out devices, each of the read-out devices including a rotary shaft and indicating means affixed to the shaft for rotation therewith;

a plurality of code discs, one for each of the visual read-out devices, respectively mounted on the corresponding shafts in coaxial relationship therewith and in spaced relationship with the associated indicating means, each of the code discs having selected areas of varying reflectivity on the disc surface opposite that which faces said indicating means;

means for rotating the shafts to change the positions of the visual read-out devices and the code discs in accordance with a varying input signal;

carriage means supported in juxtaposition with said opposite disc surfaces for movement in a direction parallel thereto, the carriage means including a reciprocable carriage and cable means resiliently connected to the carriage for advancing the carriage past said opposite surfaces;

a sensing device carried by the carriage means in position to produce electrical read-out signals determined by the selected areas of said code discs; and a drive mechanism for causing the carriage means and the sensing device to reciprocate back and forth in a direction parallel to said code discs, the drive mechanism having a bidirectional alternating current motor connected to the cable means and a pair of stop members at opposite ends of the path of travel of the carriage means for causing the motor to reverse direction as the carriage means contacts one of the stop members, the direction of rotation of said motor being determined by the first half cycle of applied alternating current of the correct polarity, said stop members preventing rotation of said motor during the first half cycle of incorrect polarity.

* * * * *